United States Patent
Yoshida (10) Patent No.: US 6,445,246 B1
(45) Date of Patent: Sep. 3, 2002

(54) SIGNAL COMPENSATOR CIRCUIT AND DEMODULATOR CIRCUIT

(75) Inventor: Akira Yoshida, Chiba (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/819,695

(22) Filed: Mar. 29, 2001

(30) Foreign Application Priority Data

Oct. 17, 2000 (JP) ........................................ 2000-316179

(51) Int. Cl.[7] ............................. H03D 3/00; H04L 27/14
(52) U.S. Cl. ..................................... 329/300; 375/345
(58) Field of Search ................................ 329/300–303; 375/324, 334–337, 345; 455/232.1, 234.1

(56) References Cited

U.S. PATENT DOCUMENTS

| | | | |
|---|---|---|---|
| 5,412,692 A | | 5/1995 | Uchida |
| 5,539,779 A | * | 7/1996 | Nagahori .................. 375/317 |
| 6,104,238 A | | 8/2000 | Mattisson et al. |

* cited by examiner

*Primary Examiner*—David Mis
(74) *Attorney, Agent, or Firm*—Venable; Norman N. Kunitz (57) ABSTRACT

The demodulator according to the invention comprises a negative feedback loop which slowly compensates for a DC potential of a demodulated signal through an integrator formed of a resistor and a capacitor, and a negative feedback loop which senses a amplitude of a demodulated signal and rapidly charges or discharge the capacitor in response to the result of the sensing, wherein the two negative feedback loop operate independently of each other.

6 Claims, 6 Drawing Sheets

FIG. 1

FIG. 2A POINT A

FIG. 2B POINT B

FIG. 2C OUTPUT SIGNAL (DIGITAL OUTPUT)

FIG. 3A POINT A

FIG. 3B POINT B

FIG. 3C OUTPUT SIGNAL (DIGITAL OUTPUT)

FIG. 4A POINT A

FIG. 4B POINT B

FIG. 4C OUTPUT SIGNAL (DIGITAL OUTPUT)

SIGNAL COMPENSATOR CIRCUIT AND DEMODULATOR CIRCUIT

BACKGROUND OF THE INVENTION

1. Field of the Invention

The present invention relates to a signal compensator circuit and a demodulator circuit which are applicable, for example, to a receiver for mobile communications.

2. Description of the Related Art

FSK (Frequency Shift Keying) signals often used in radio communications suffer from offset variations which may occur in a DC potential of a detected signal due to influences such as a difference between a received signal frequency and a predefined carrier frequency.

U.S. Pat. No. 6,104,238 (hereinafter called "reference 1") discloses a technique of suppressing variations in a DC potential of an output of a detector circuit, which involves smoothing the detected output, adding a DC component of the detected output to a frequency control signal for a channel selector filter or the like at the preceding stage, and changing the center frequency of the channel selector filter, in order to follow the variations in the DC offset.

U.S. Pat. No. 5,412,692 (hereinafter called "reference 2") in turn discloses that a maximum level and a minimum level of a detected output signal are detected, and an intermediate potential between the maximum and minimum levels is generated for use as a reference potential for a comparator to derive a final output signal. The intermediate potential follows variations in a DC potential of the detected output.

Some types of radio communication systems time-division-multiplexes a transmission state and a reception state. In addition, other than sequential switching between the transmission state and the reception state, a pause state (a state in which a supply voltage is applied, but neither transmission nor reception is performed) may exist in some cases during the switching. For this reason, at the time a communication apparatus switches to the reception state, a received signal suddenly reaches a receiver unit of the communication apparatus, thereby causing a sudden change in a DC potential of a detected signal at that time.

Generally, in a radio communication system, a preamble pattern is added to the beginning of a transmission signal thereof, and used to compensate for the above-mentioned sudden change in a DC potential.

However, the length of the preamble pattern differs from one radio communication system to another in particular applications. For reliably demodulating a signal with an extremely short length of pattern (for example, approximately four bits), it is necessary to rapidly follow the sudden change in the DC potential.

A transmission signal in turn may include a so-called same-code sequence pattern which is comprised of a sequence of high levels or a sequence of low levels. A demodulator circuit is required to operate until a sequence length defined for an applied system even for this same-code sequence pattern without signal errors. Generally, a tolerance to a signal error caused by the same-code sequence pattern (hereinafter simply called the "same-code sequence tolerance") runs counter to the aforementioned operation involved in the rapid compensation for a sudden change in a DC potential.

In the circuit configuration described in reference 1, a time required for the DC potential compensation is the sum of a time required for smoothing a detected output and an absolute delay time inherent to a channel selector filter and a detector circuit. Therefore, a demodulator circuit which employs a high-order filter experiences difficulties in rapidly compensating for a DC potential since it requires a large delay time.

On the other hand, the circuit configuration described in reference 2 must reduce the time constant of an integrator circuit for detecting a maximum level and a minimum level of a detected output for realizing a rapid DC potential compensation, resulting in a deterioration in the same-code sequence tolerance.

OBJECT AND SUMMARY OF THE INVENTION

It is therefore an object of the present invention to provide a signal compensator circuit which is capable of performing a rapid DC potential compensation and even capable of compensating for DC variations due to a same-code sequence pattern or the like, and a demodulator circuit including the signal compensator circuit.

To achieve the above object, a signal compensator circuit according to the present invention comprises variable gain amplifying means for amplifying an input signal with a gain variable with a gain control signal, first signal generating means for detecting variations in a DC level of an output signal from the amplifying means to generate a DC level variation signal indicative of the magnitude of the detected variations in the DC level, second signal generating means for detecting variations in an amplitude level of the output signal from the amplifying means to generate an amplitude level variation signal indicative of the magnitude of the detected variations in the amplitude level, and gain control signal generating means for integrating the DC level variation signal with predetermined time constant, integrating the amplitude level variation signal with a time constant smaller than the predetermined time constant, and generating the gain control signal based on results of the integrations.

Also, a demodulator circuit according to the present invention comprises detecting means for detecting a modulated input signal, variable gain amplifying means using an output from the detecting means as an input signal for amplifying the input signal with a gain variable with a gain control signal, first signal generating means for detecting variations in a DC level of an output signal from the amplifying means to generate a DC level variation signal indicative of the magnitude of the detected variations in the DC level, second signal generating means for detecting variations in an amplitude level of the output signal from the amplifying means to generate an amplitude level variation signal indicative of the magnitude of the detected variations in the amplitude level, gain control signal generating means for integrating the DC level variation signal with a predetermined time constant, integrating the amplitude level variation signal with a time constant smaller than the predetermined time constant, and generating the gain control signal based on results of the integrations, and comparing means for comparing the output signal from the amplifying means with a predetermined reference level to output a digital signal which has a definite logical level.

DETAILED DESCRIPTION OF THE PREFERRED EMBODIMENTS

A first embodiment of a demodulator circuit according to the present invention will hereinafter be described with reference to the accompanying drawings.

Figure 1:
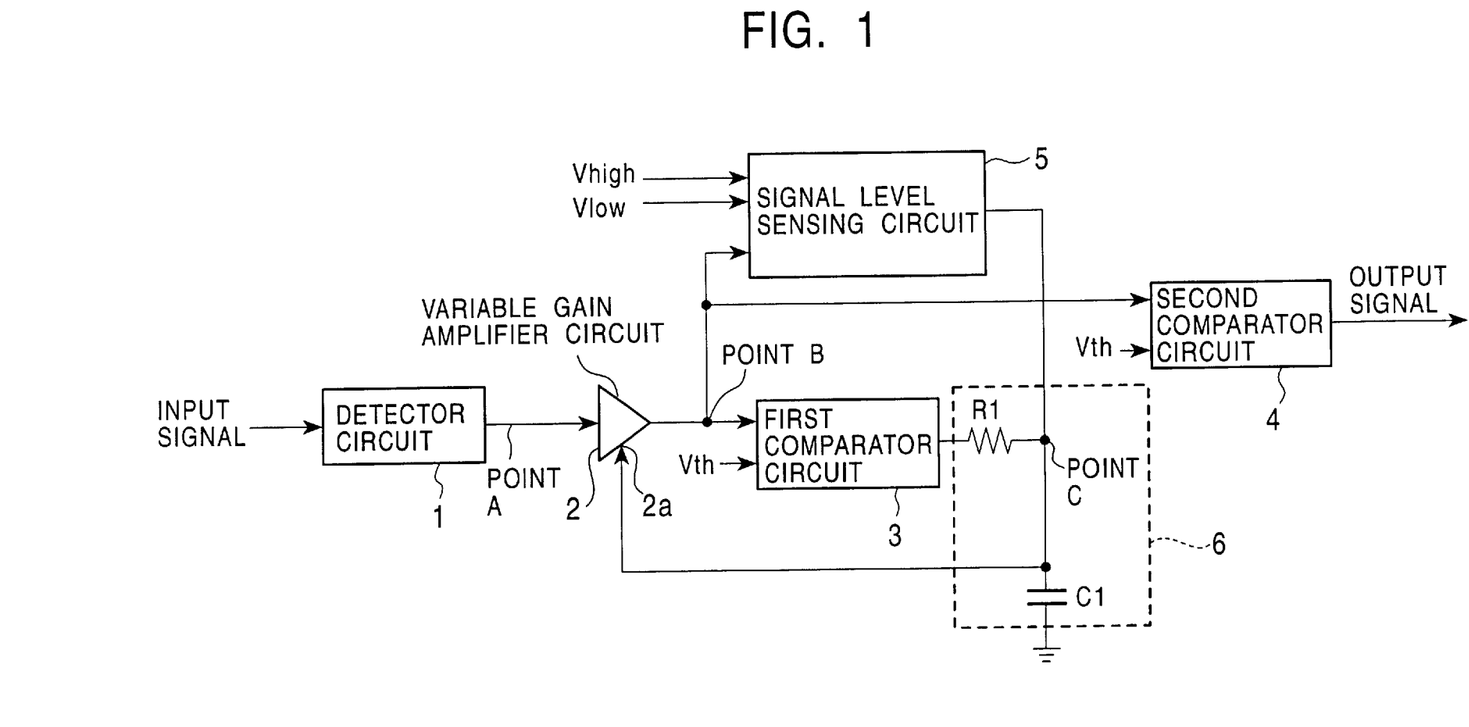
FIG. 1 is a block diagram illustrating the configuration of a demodulator circuit according to a first embodiment.

FIG. 1 is a block diagram generally illustrating the configuration of the demodulator circuit according to the first embodiment. In FIG. 1, the demodulator circuit according to the first embodiment comprises a detector circuit 1, a variable gain amplifier circuit 2, a first comparator 3, a second comparator 4, a signal level sensing circuit 5, a resistor R1, and a capacitor C1. The resistor R1 and the capacitor C1 form an integrator circuit 6. The variable gain amplifier circuit 2, first comparator 3, signal level sensing circuit 5, resistor R1, and capacitor C1 form a signal compensator circuit.

The detector circuit 1 demodulates an input signal (for example, an FSK modulated signal) and outputs the demodulated signal to the variable gain amplifier circuit 2 as an analog signal.

The variable gain amplifier circuit 2 amplifies the demodulated analog signal to an amplitude level which enables the first comparator circuit 3 and the second comparator circuit 4 to operate, and outputs the amplified signal to the first comparator 3 and the second comparator 4 as well as to the signal level sensing circuit 5. The variable gain amplifier circuit 2 has an output signal adjusting terminal 2a. The gain of the variable gain amplifier circuit 2 varies in accordance with a voltage input to the output voltage adjusting terminal 2a to vary the output voltage. The variable gain amplifier circuit 2 operates to reduce the output voltage as the voltage input to the output voltage adjusting terminal 2a is increased, and increases the output voltage as the voltage input to the output voltage adjusting terminal 2a is reduced.

The signal level sensing circuit 5 pushes out an output current when an input signal voltage applied thereto (the output voltage of the variable gain amplifier circuit 2) exceeds a reference high potential Vhigh, and draws in the output current when the input signal voltage is reduced below a reference low potential Vlow. The signal level sensing circuit 5 does not push out or draw in a current when the input signal voltage lies in a range of the reference low potential Vlow to the reference high potential Vhigh. In other words, the signal level sensing circuit 5 senses which of the three ranges the output voltage of the variable gain amplifier circuit 2 belongs to. Then, in accordance with the result of the sensing, the signal level sensing circuit 5 pushes out the output current, and annihilates the output current (holds a high output impedance state) or draws in the output current.

The first comparator circuit 3 compares an input signal voltage applied thereto (the output voltage of the variable gain amplifier circuit 2) with a logical level determining reference potential Vth. The first comparator circuit 3 increases an output voltage when the input signal voltage exceeds the logical level determining reference potential Vth, and reduces the output voltage when the input signal voltage is reduced below the logical level determining reference potential Vth.

The second comparator circuit 4, like the first comparator circuit 3, compares an input signal voltage applied thereto (the output voltage of the variable gain amplifier circuit 2) with the logical level determining reference potential Vth. The second comparator circuit 4 represents the result of the comparison as a logical level (for example, a CMOS level), and delivers it as an output signal of the demodulator circuit.

The resistor R1 and the capacitor C1 form the integrator circuit 6 as mentioned above. The integrator circuit 6 has an input terminal (one terminal of the resistor R1) connected to an output terminal of the first comparator circuit 3. Therefore, the capacitor C1 is charged and discharged in accordance with the output voltage from the first comparator circuit 3 and in conformity to a time constant R1×C1. This causes a change in a potential (integration voltage) at a connection point (point C) of the resistor R1 and the capacitor C1. Also, the connection point (point C) of the resistor R1 and the capacitor C1 is also connected to an output terminal of the signal level sensing circuit 5. Therefore, the capacitor C1 is also charged and discharged in response to the output current pushed out or drawn in by the signal level sensing circuit 5, resulting also in a change in the potential at the point C (integration voltage). The potential at the point C is applied to the output voltage adjusting terminal 2a of the variable gain amplifier circuit 2.

As described above, the variable gain amplifier circuit 2, first comparator 3 and integrator circuit 6 form a negative feedback circuit. This negative feedback circuit stabilizes a DC potential of a demodulated signal (a DC potential at a point B) at a potential identical to the logical level determining reference potential Vth. Its follow-up speed is determined by the time constant R1×C1 defined by the resistor R1 and the capacitor C1, and corresponds to slow DC voltage variations at the point B. Stated another way, the time constant R1×C1 defined by the resistor R1 and the capacitor C1 is selected to correspond to the slow DC potential variations at the point B.

Also, the variable gain amplifier circuit 2, the signal level sensing circuit 5, and the capacitor C1 in the integrator circuit 6 form a negative feedback circuit. This negative feedback circuit controls a voltage amplitude of the demodulated signal such that it is confined in a range of the reference low potential Vlow to the reference high potential Vhigh. It should be noted that a median potential between the reference low potential Vlow and the reference high potential Vhigh is equal to the logical level determining reference potential Vth. Since this feedback circuit does not include the resistor R1 within the feedback loop, the result of sensing by the signal level sensing circuit 5 is extremely rapidly reflected to the value of the potential at the point C (the integration voltage).

As described above, the first embodiment is characterized in that the demodulator circuit has two feedback loops such that a low speed loop is used to follow slow DC variations, while a high speed loop is used to follow rapid DC variations.

Next, the operation of the demodulator circuit according to the first embodiment will be explained.

First, the basic operation of the demodulator circuit according to the first embodiment will be explained with reference to FIG. 2. FIG. 2 shows signal waveforms at various points in the demodulator circuit of the first embodiment during a normal communication operation, in correspondence to variations in the DC potential and the amplitude of a demodulated signal.

Figure 2A:
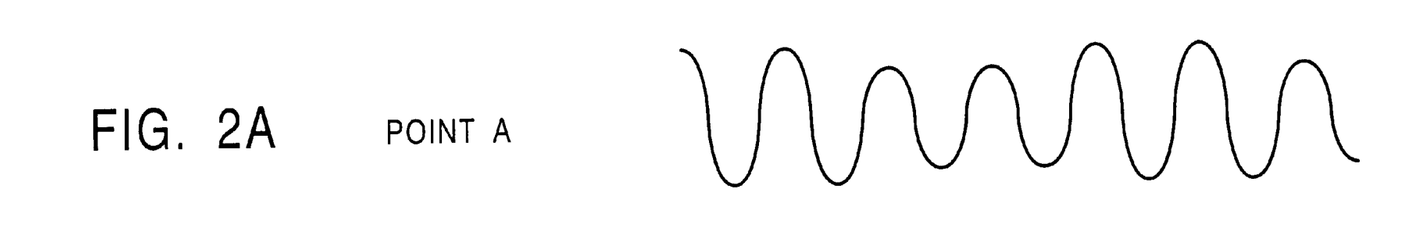
FIG. 2 is a waveform chart (1) showing signal waveforms at various points in the demodulator circuit of the first embodiment for explaining the operation thereof.
Figure 2B:
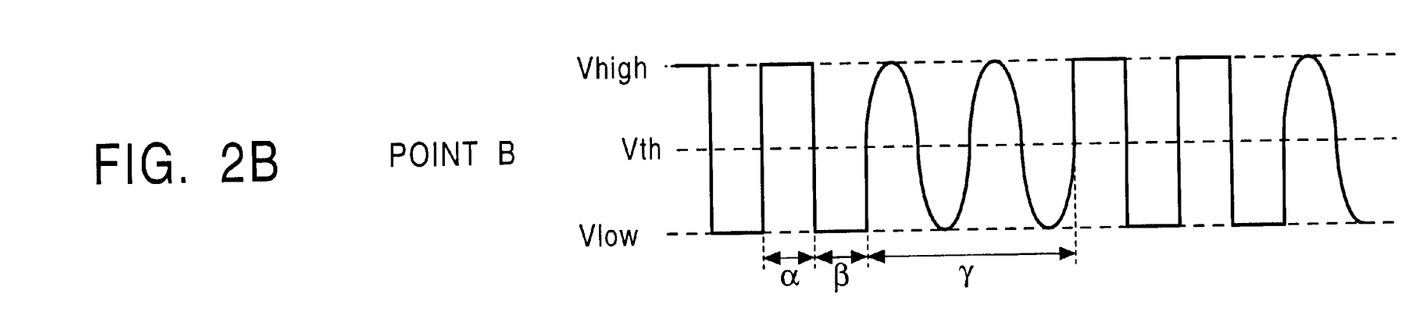

A modulated input signal is demodulated by the detector circuit 1. The demodulated analog signal is amplified by the variable gain amplifier circuit 2. Here, FIG. 2A shows the waveform of an output signal from the detector circuit 1 (waveform of a voltage at a point A); and FIG. 2B shows the waveform of an output signal from the variable gain amplifier circuit 2 (waveform of a voltage at a point B). While FIG. 2A illustrates that the voltage amplitude of the demodulated signal varies, a DC potential of the signal may also vary.

Even if the DC potential of the demodulated signal output from the detector circuit 1 varies, the DC potential of the output signal of the variable gain amplifier circuit 2 (at the point B) remains at the potential identical to the logical level determining reference potential Vth in the following manner.

The potential at the point B is compared with the logical level determining reference potential Vth by the first comparator 3. When the potential at the point B is higher than the logical level determining reference potential Vth, the capacitor C1 is charged through the resistor R1 by an output voltage of the first comparator 3, thereby increasing the integration potential (potential at the point C). Since the increased integration potential is input to the output voltage adjusting terminal 2a of the variable gain amplifier circuit 2, the variable gain amplifier circuit 2 reduces the potential at the point B. On the other hand, when the potential at the point B is lower than the logical level determining reference potential Vth, the capacitor C1 is discharged through the resistor R1 by the output voltage of the first comparator 3, thereby reducing the integration voltage. Since the reduced integration voltage is input to the output voltage adjusting terminal 2a of the variable gain amplifier circuit 2, the variable gain amplifier circuit 2 increases the potential at the point B. The negative feedback operation as described is normally repeated to maintain the potential at the point B identical to the reference potential Vth.

Also, even if the signal amplitude of a demodulated signal output from the detector circuit 1 varies beyond a desired amplitude, the amplitude of the output signal of the variable gain amplifier circuit 2 (at the point B) remains in the range of the reference low potential Vlow to the reference high potential Vhigh with the operation described below.

The output signal of the variable gain amplifier circuit 2 (at the point B) is input to the signal level sensing circuit 5, and compared with the reference low potential Vlow and the reference high potential Vhigh. Since the signal level sensing circuit 5 pushes out an output current when the potential at the point B exceeds the reference high potential Vhigh, the capacitor C1 is directly charged, thereby rapidly increasing the integration voltage. Since the integration voltage is input to the output voltage adjusting terminal 2a of the variable gain amplifier circuit 2, the variable gain amplifier circuit 2 operates to reduce the potential at the point B. At the time the potential at the point B is reduced to the reference high potential Vhigh or lower, the output current from the signal level sensing circuit 5 becomes zero. At this time, the integration voltage on the capacitor C1 is at a constant value, and simultaneously, the potential at the point B is at a constant value (Vhigh) (a period of time α in FIG. 2B).

On the contrary, when the potential at the point B is reduced below the reference low potential Vlow, the signal level sensing circuit 5 draws in an output current to directly discharge the capacitor C1, thereby rapidly reducing the integration voltage. Since the integration voltage is input to the output voltage adjusting terminal 2a of the variable gain amplifier circuit 2, the variable gain amplifier circuit 2 operates to increase the potential at the point B. At the time the potential at the point B is increased to the reference potential Vlow or higher, the output current of the signal level sensing circuit 5 becomes zero. At this time, the integration voltage on the capacitor C1 is at a constant value, and simultaneously, the potential at the point B is at a constant value (Vlow) (a period of time β in FIG. 2B).

Also, when the potential at the point B lies in the range of the reference low potential Vlow to the reference high potential Vhigh, the output current of the signal level sensing circuit 5 becomes zero, thus exerting no influence on the capacitor C1 (a period of time γ in FIG. 2B).

With the foregoing operation, the voltage amplitude at the point B remains within the range of the reference low potential Vlow to the reference high potential Vhigh, as illustrated in FIG. 2B.

Figure 2C:
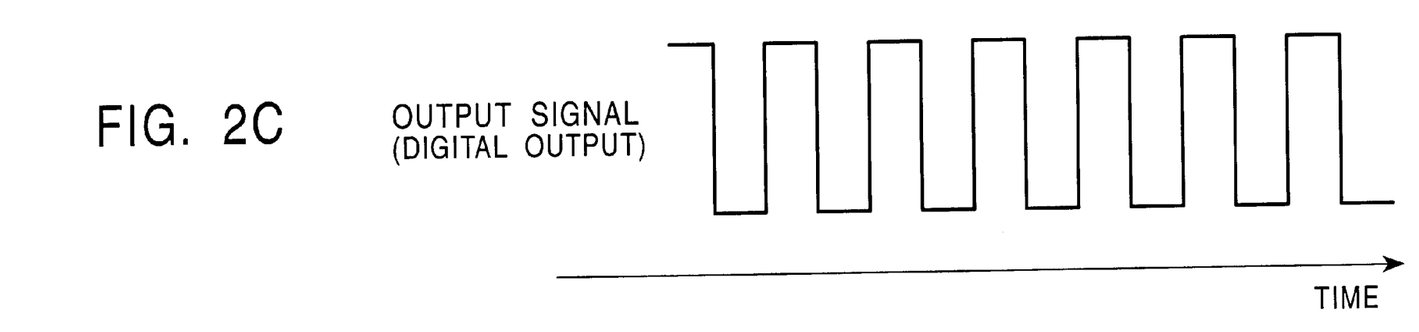

The demodulated signal at the point B is input to the second comparator circuit 4 for comparison with the logical level determining reference potential Vth, and the second comparator circuit 4 outputs an output signal indicative of a logical level (the output signal waveform of FIG. 2C).

As described above, even if the demodulated signal from the detector circuit 1 suffers from DC variations or amplitude variations, the two types of negative feedback circuits, which operate independently of each other, suppress the DC variations and the amplitude variations of the demodulated signal. The demodulated signal with the suppressed variations is compared with the logical level determining reference potential Vth to determine the logical level of the demodulated signal, thereby making it possible to improve the accuracy of the output signal (digital output signal) from the demodulator circuit.

Next, the operation for compensating for a sudden DC potential change, which may occur when a received signal reaches in a burst manner, will be described with reference to FIG. 3.

Figure 3A:
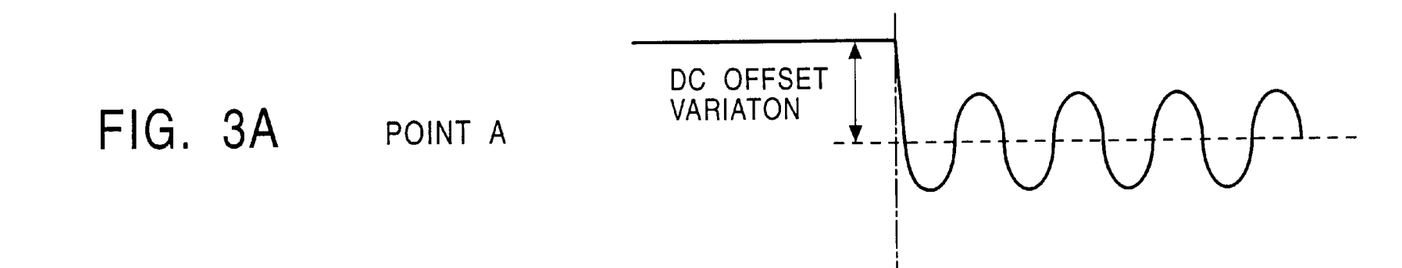
FIG. 3 is a waveform chart (2) showing signal waveforms at various points in the demodulator circuit of the first embodiment for explaining the operation thereof.

Assume that an input signal is demodulated by the detector circuit 1, and a DC potential of the output signal of the detector circuit 1 (a potential at the point A) suddenly varies downwardly at time t=0, as shown in FIG. 3A. Such a variation may occur, for example, at the time the demodulator circuit transitions from a received signal waiting state to a received signal arriving state. It should be noted that a DC potential at the point B at a time t<0 remains at the potential identical to the logical level determining reference potential Vth by the feedback loop formed of the variable gain amplifier circuit 2, first comparator 3 and integrator circuit 6.

Figure 3B:
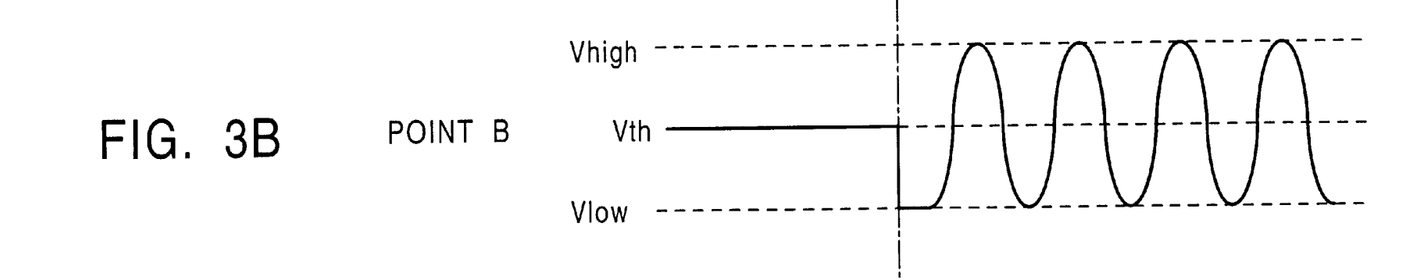
Figure 3C:
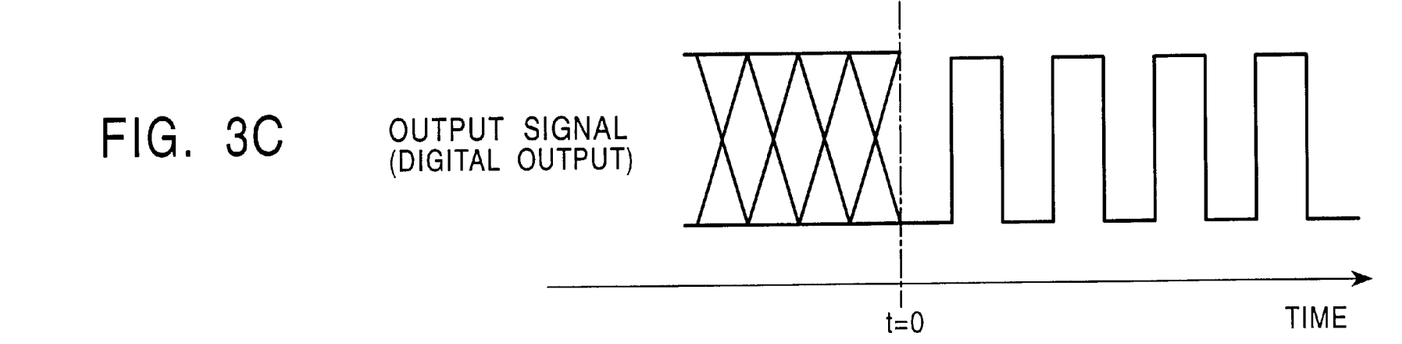

Due to the DC potential variation which has occurred at time t=0, the output potential of the variable gain amplifier circuit 2 (potential at the point B) is also reduced in response, so that the DC potential at the point B is reduced to Vth or lower. However, at the time the potential at the point B is reduced to the reference low potential Vlow or lower, the signal level sensing circuit 5 rapidly discharges the capacitor C1, as described above, thereby preventing the potential at the potential B from dropping below the reference low potential Vlow. In other words, the DC potential at the point B is rapidly compensated for (FIG. 3B). Then, the potential at the point B is converted to a logical level by the second comparator 4.

Similarly, when the DC potential at the point A (modulated signal) suddenly rises, a voltage limitation functions by the action of the reference high potential Vhigh of the signal level sensing circuit 5, though not shown, thereby rapidly compensating for the DC potential at the point B, by the operation symmetric to the foregoing.

Thus, even if a suddenly increasing DC potential signal is received and causes variations in the DC potential at the point A, the foregoing rapid compensating operation forces the DC potential at the point B to fall within the range of the reference low potential Vlow to the reference high potential Vhigh. In this way, the second comparator circuit 4 can sufficiently identify the logical level of a demodulated signal.

Next, the operation of the demodulator circuit when a demodulated signal from the detector circuit 1 has a same-code sequence pattern will be explained with reference to FIG. 4. In this event, the explanation will be given on the assumption that a DC potential at the point B has already been identical to the logical level determining reference potential Vth.

Figure 4A:
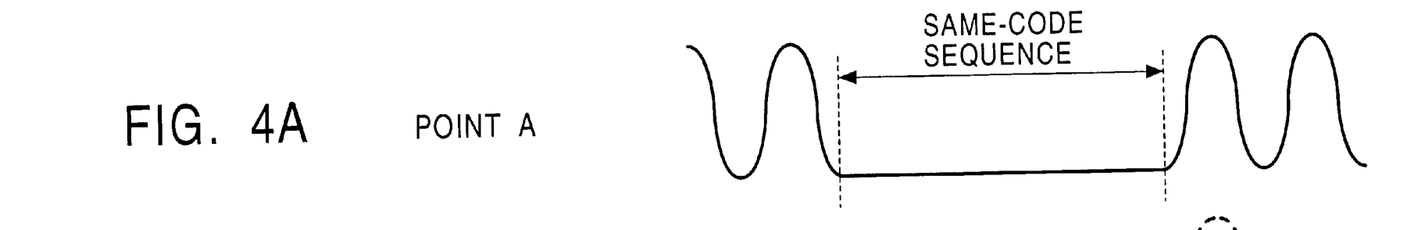
FIG. 4 is a waveform chart (3) showing signal waveforms at various points in the demodulator circuit of the first embodiment for explaining the operation thereof.

When a signal demodulated by the detector circuit 1 has a same-code sequence pattern, the signal will have a waveform (waveform at the point A) as shown in FIG. 4A. As can be seen, FIG. 4A shows that logical level "0" continues.

Figure 4B:
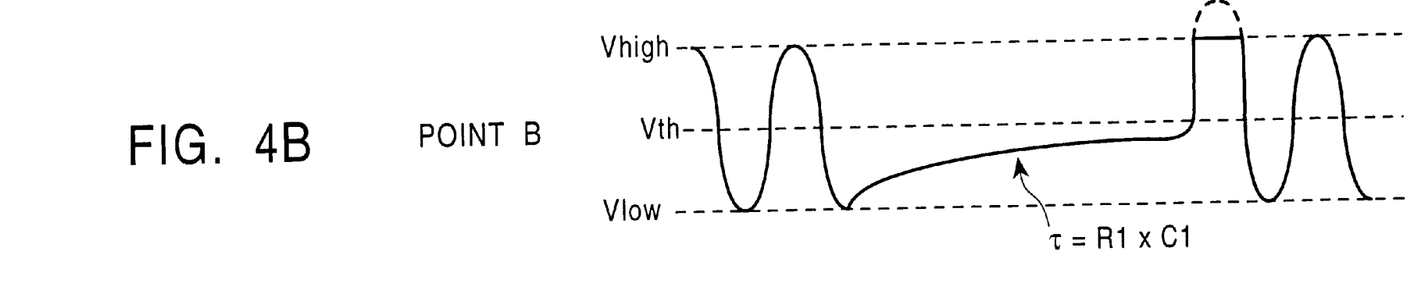

In a same-code sequence period, no AC signal components are included in a demodulated signal. For this reason, the output signal of the variable gain amplifier circuit 2 (the potential at the point B) converges to the logical level determining reference potential Vth by the low speed feedback loop formed of the variable gain amplifier circuit 2, first comparator 3 and integrator circuit 6 at a speed determined by the time constant τ (=R1×C1) defined by the resistor R1 and the capacitor C1, as shown in FIG. 4B. Here, if the time constant τ is chosen to be larger than a required time for a same-code sequence length defined by a radio system, to which the compensator circuit of the present invention is applied, (and smaller than slow DC potential variations, later described), the potential at the point B will not completely converge to the logical level determining reference potential Vth. Thus, the second comparator circuit 4 can convert a demodulated signal after amplification to a logical level without erroneously identifying the logical level.

Immediately after the end of the same-code sequence period, due to a slow increase in the potential at the point B during this period, an incoming signal causes the potential at the point B to exceed the reference high potential Vhigh. In this event, however, since the DC potential at the point B is rapidly compensated for, as is the aforementioned case of a DC potential variation which occurs when a received signal arrives in a burst manner, no erroneous code identification will occur in the second comparator circuit 4.

Figure 4C:
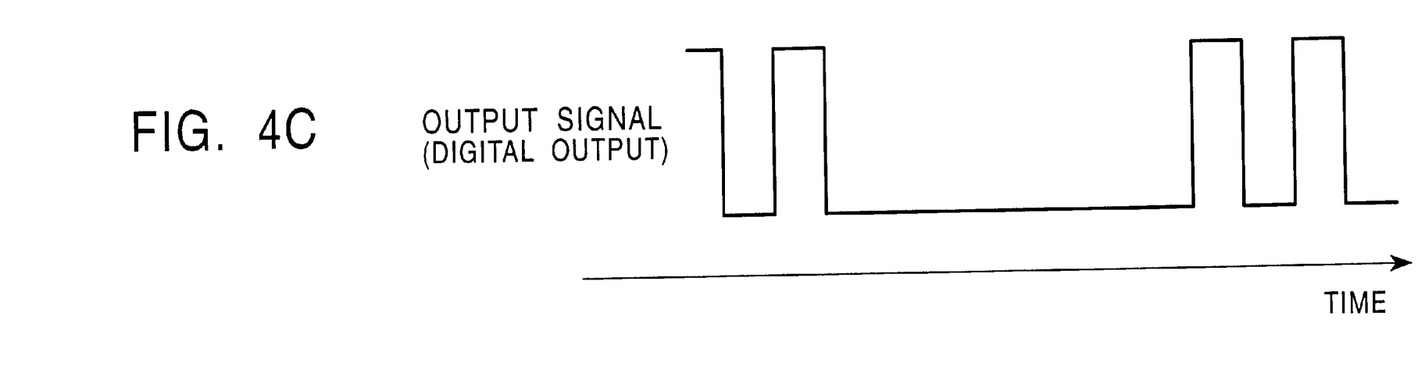

FIG. 4 shows an example in which logical level "0" continues as a same-code sequence pattern. With a same-code sequence pattern having a continuous logical level "1," the operation symmetric to the foregoing is performed, so that no erroneous code identification will occur in the second comparator circuit 4.

Finally, the operation of the demodulator circuit when a DC potential slowly varies in a received signal will be explained with reference to FIG. 5.

Figure 5A:
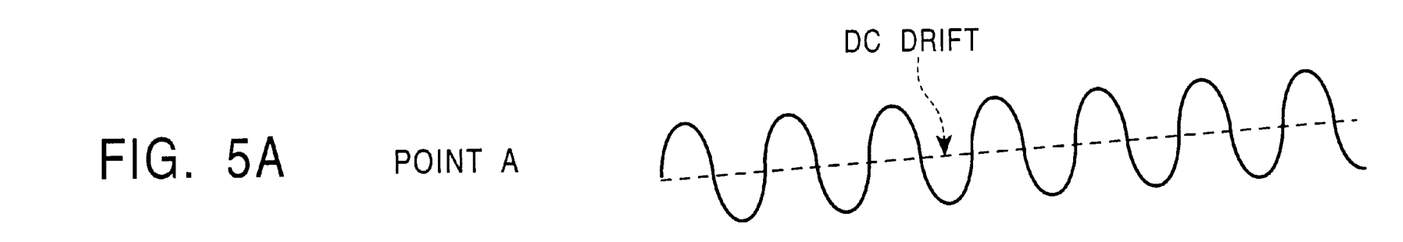
FIG. 5 is a waveform chart (4) showing signal waveforms at various points in the demodulator circuit of the first embodiment for explaining the operation thereof.
Figure 5B:
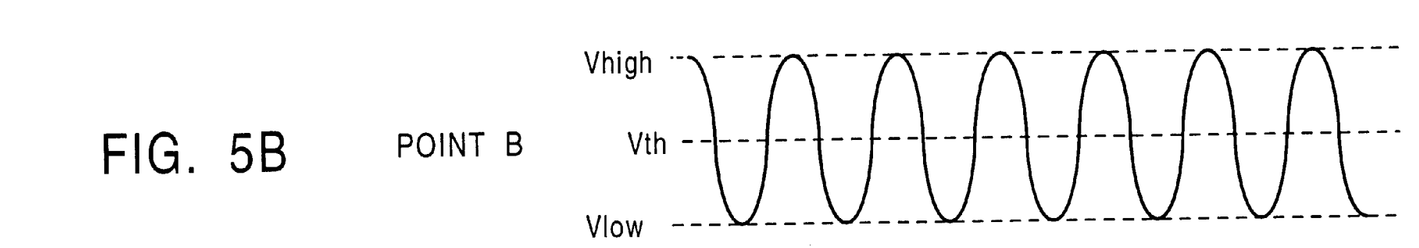
Figure 5C:
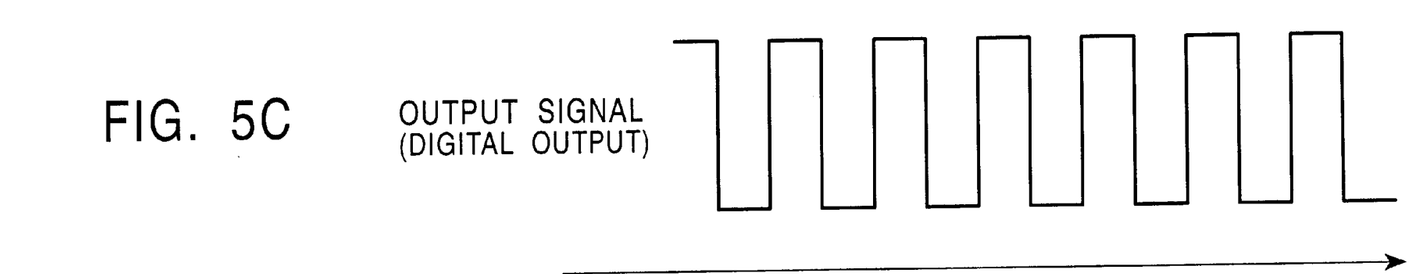

When a received signal includes slow DC potential variations (a DC drift), a demodulated signal from the detector circuit 1 (a DC potential at the point A) also rises (falls) slowly, as illustrated in FIG. 5A. Here, if the time constant τ of the integrator circuit 6 is set to be smaller than the slow DC potential variation time, a DC potential of an output signal from the variable gain amplifier circuit 2 (a DC potential at the point B) will not vary by the action of the low speed feedback loop formed of the variable gain amplifier circuit 2, first comparator 3 and integrator circuit 6, as shown in FIG. 5B. Thus, the second comparator circuit 4 can output a logical level without erroneously identifying the logical level, as shown in FIG. 5C.

As described above, according to the first embodiment, the demodulator circuit comprises a negative feedback loop which slowly compensates for a DC potential of a demodulated signal through an integrator circuit formed of a resistor and a capacitor, and a negative feedback loop which senses a voltage amplitude of a demodulated signal and rapidly charges or discharges the capacitor in response to the result of the sensing, wherein the two negative feedback loop operate independently of each other. Thus, advantageously, a rapid DC potential compensation and the same-code sequence tolerance can be flexibly set independently of each other by selecting the resistance value and the capacitance value as well as the fast charging/discharging capabilities.

In the following, a second embodiment of a demodulator circuit according to the present invention will be described with reference to the accompanying drawings.

Figure 6:
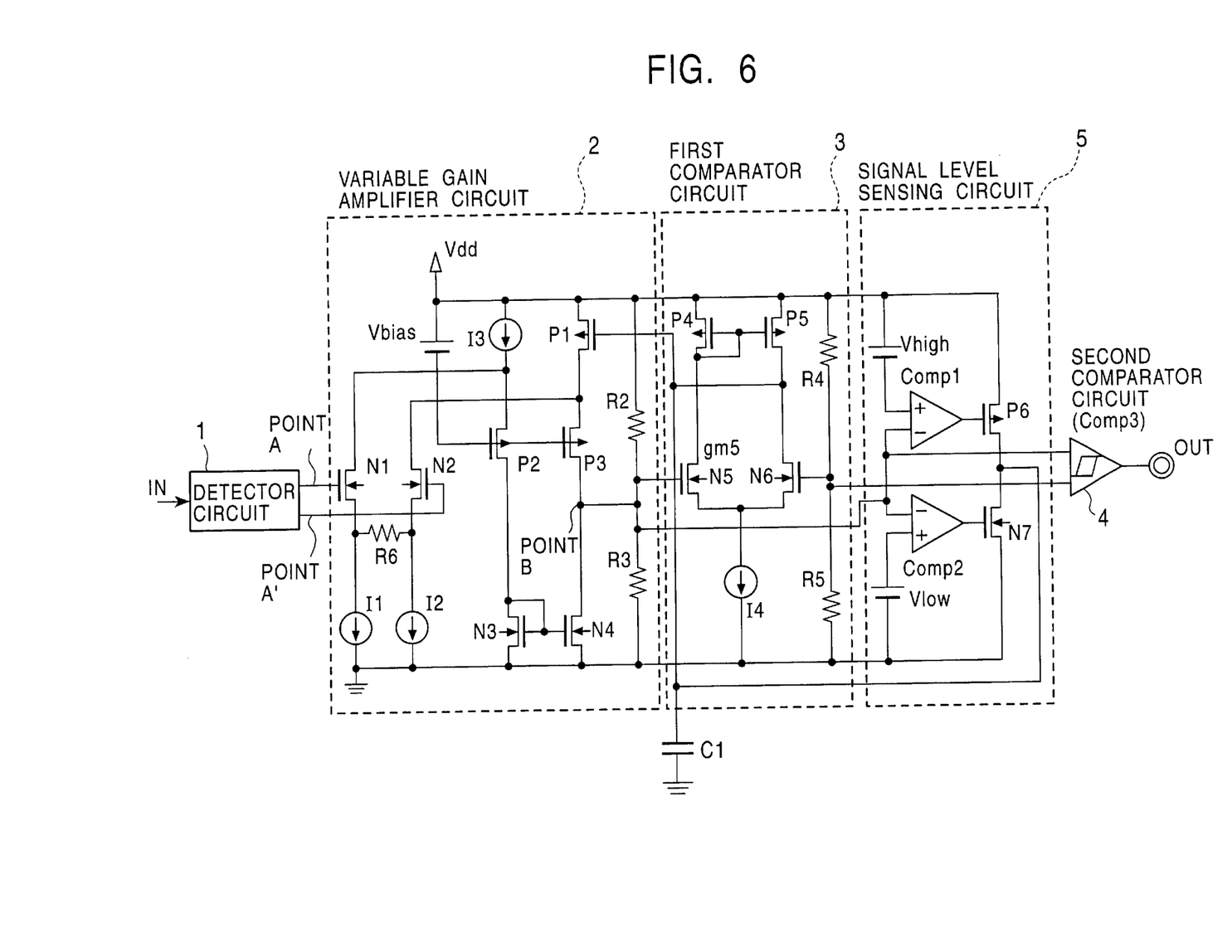
FIG. 6 is a circuit diagram illustrating the configuration of a demodulator circuit according to a second embodiment.

FIG. 6 generally illustrates the configuration of the demodulator circuit according to the second embodiment. FIG. 6 is a circuit diagram which illustrates a portion of the demodulator circuit in a functional block form, wherein corresponding parts identical to those in FIG. 1 according to the aforementioned first embodiment are designated the same reference numerals.

In FIG. 6, the demodulator circuit according to the second embodiment generally comprises a detector circuit 1, a variable gain amplifier circuit 2, a first comparator 3, a second comparator 4 (comparator Comp3), and a signal level detector circuit 5 as well. Additionally, FIG. 6 also includes a capacitor C1 corresponding to the capacitor C1 which forms part of the integrator circuit 6 in the first embodiment. The variable gain amplifier circuit 2, first comparator circuit 3, signal level sensing circuit 5, and an integrator circuit, later described, form a signal compensator circuit.

The basic functions of the detector circuit 1, variable gain amplifier circuit 2, first comparator circuit 3, second comparator circuit 4 (comparator Comp3), signal level sensing circuit 5 and so on are similar to those in the first embodiment.

In the second embodiment, the detector circuit 1 is only required to be capable of detecting an input signal (for example, an FSK modulated signal), and providing a balanced output of the resulting demodulated signal, so that description on the internal configuration thereof is omitted.

The second comparator circuit 4 may be comprised of a simple comparator Comp3 which compares a demodulated signal after amplification with a logical level determining reference voltage Vth to output a logical level "1" or "0" in accordance with a magnitude relationship therebetween. Thus, in the following, description will be focused on the detailed configuration of the variable gain amplifier circuit 2, the first comparator circuit 3 and the signal level sensing circuit 5.

The variable gain amplifier circuit 2 has four NMOS transistors N1–N4, three PMOS transistors P1–P3, three constant current sources I1–I3, three resistors R6, R2, R3, and a constant voltage source Vbias.

The first comparator circuit 3 has two NMOS transistors N5, N6, two PMOS transistors P4, P5, a constant current source I4, and two resistors R4, R5.

Further, the signal level sensing circuit 5 has a PMOS transistor P6 and an NMOS transistor N7, two constant voltage sources Vhigh, Vlow, and two comparators Comp1, Comp2.

The detector circuit 1 has one output terminal (a point A) connected to a gate terminal of the NMOS transistor N1, and the detector circuit 1 has the other output terminal (a point A') connected to a gate terminal of the NMOS transistor N2. These NMOS transistors N1, N2 have their respective source terminals connected to "+" terminals of the constant current sources I1, I2, respectively, and also connected to each other through the resistor R6. One terminal of the constant current source I1 and one terminal of the constant current source I2 are grounded together. The NMOS transistor N1 has a drain terminal connected to a "−" terminal of the constant current source I3 and also connected to a source terminal of the PMOS transistor P2. The NMOS transistor N2 has a drain terminal connected to a drain terminal of the PMOS transistor P1 and also connected to a source terminal of the PMOS transistor P3.

The PMOS transistors P2 and P3 have their gate terminals connected to a "−" terminal of the constant voltage source Vbias, while the constant voltage source Vbias has a "+" terminal connected to a power supply terminal Vdd.

The PMOS transistor P2 has a drain terminal connected to a drain terminal and a gate terminal of the NMOS transistor N3, and also connected to a gate terminal of the NMOS transistor N4. The NMOS transistors N3 and N4 have their source terminals grounded together. The NMOS transistor N4 has a drain terminal connected to a drain terminal of the PMOS transistor P3, and also connected to one terminal of the resistor R2 and one terminal of the resistor R3. Further, the NMOS transistor N4 has a drain terminal connected to a gate terminal of the NMOS transistor N5, also connected to "−" input terminals of the comparators Comp1 and Comp2, respectively, and further connected to one input terminal of the comparator Comp3. The resistor R2 has the other terminal connected to the power supply terminal Vdd, while the resistor R3 has the other terminal grounded.

A "+" terminal of the constant current source I3 and a source terminal of the PMOS transistor P1 are connected to the power supply terminal Vdd. The PMOS transistor P1 has a gate terminal connected to one terminal of the capacitor C1, and connected to a drain terminal of the PMOS transistor P5. Further, the PMOS transistor P1 has a gate terminal connected to a drain terminal of the NMOS transistor N6, connected to a drain terminal of the PMOS transistor P6, and connected to a drain terminal of the NMOS transistor N7. The capacitor C1 has the other terminal grounded.

The NMOS transistor N5 has a drain terminal connected to a drain terminal and a gate terminal of the PMOS transistor P4, and also connected to a gate terminal of the PMOS transistor P5. The PMOS transistors P4 and P5 have their source terminals connected to the power supply terminal Vdd. The NMOS transistor N5 has a source terminal connected to a source terminal of the NMOS transistor N6, and also connected to a "+" terminal of the constant current source I4. Further, the constant current source I4 has a "−" terminal grounded.

The NMOS transistor N6 has a gate terminal connected to one terminal of the resistor R4 and one terminal of the resistor R5, and also connected to the other input terminal of the comparator Comp3. The resistor R4 has the other end connected to the power supply terminal Vdd, while the resistor R5 has the other terminal grounded.

The comparator Comp1 has a "+" input terminal connected to a "−" terminal of the constant voltage source Vhigh, while the constant voltage source Vhigh has a "+" terminal connected to the power supply terminal Vdd. The comparator Comp2 has an "+" input terminal connected to a "+" terminal of the constant voltage source Vlow, while the constant voltage source Vlow has a "−" terminal grounded. The comparator Comp1 has an output terminal connected to a gate terminal of the PMOS transistor P6. The comparator Comp2 has an output terminal connected to a gate terminal of the NMOS transistor N7. The PMOS transistor P6 has a source terminal connected to the power supply terminal Vdd, while the NMOS transistor N7 has a source terminal grounded.

Next, the operation of the demodulator circuit according to the second embodiment, particularly, the operation of the variable gain amplifier circuit 2, first comparator circuit 3 and signal level sensing circuit 5 will be described.

Assume herein that the "+" terminals of the constant current sources I1-I4 function as current draw-in terminals, and the "−" terminals of the same function as current supply terminals. Assume also that the resistor R2 and the resistor R3 have the same resistance value, and the resistor R4 and the resistor R5 also have the same resistance value.

The detector circuit 1 has a function of demodulating an input signal and providing balanced outputs as analog signals (a potential at the point A and a potential at the point A' are balanced). The comparator Comp3, serving as the second comparator circuit 4, outputs an output signal at a logical level (for example, a CMOS level). Since these circuits are generally known, further description on the operation of the detector circuit 1 and the comparator Comp3 is omitted.

First, the operation of the variable gain amplifier circuit 2 will be described. The amplification factor of the variable gain amplifier circuit 2 is determined by the ratio of the resistor R6 to the resistor R2 (or R3). As described later, a potential at a point B is determined by a potential difference between the points A-A', and a potential at the gate terminal of the PMOS transistor P1. The potential at the point B is a demodulated signal after amplification.

It should be understood that the points A and A' correspond to the point A in the first embodiment, and the point B corresponds to the point B in the first embodiment.

The PMOS transistor P1 functionally constitutes a variable current source. In a stable state, a stable integration voltage on the capacitor C1 is applied to the gate terminal of the PMOS transistor P1, so that the PMOS transistor P1 can be regarded as a constant current source which generates a constant current equal to the constant current source I3.

When a potential difference exists between the points A-A', a current in accordance with the potential difference flows through resistor R6 in a direction in accordance with the positive/negative of the potential difference. As a result, a current flowing at the point B differs from a current flowing through the source-drain of the PMOS transistors P1. As a result, the potential at the point B differs from a divided voltage value Vdd/2 generated by the resistors R2 and R3. This change corresponds to the potential difference between the points A-A', that is, the potential at the point B is a demodulated signal after amplification.

Next, an output voltage adjusting operation in the variable gain amplifier circuit 2 (an operation for adjusting the potential at the point B) will be described.

With a potential difference between the points A-A' remaining zero, if a drain-source current of the PMOS transistor P1 is equal to the constant current source I3, no current flows into the point B from a series circuit of the resistors R2 and R3, and no current flows from the point B to the series circuit comprised of the resistors R2 and R3, by the action of a current mirror circuit comprised of the NMOS transistors N3 and N4. Therefore, the potential at the point B is equal to the divided voltage value Vdd/2 generated by the resistors R2 and R3.

Here, as a gate voltage of the PMOS transistor P1 (a charged voltage on the capacitor C1) rises, the source-drain current is reduced. This causes a current flowing through the resistor R2 to be larger than a current flowing through the resistor R3, so that the potential at the point B falls. It should be noted that the gate terminal of the PMOS transistor P1 corresponds to the output voltage adjusting terminal 2a in the first embodiment. Conversely, as the gate voltage of the PMOS transistor P1 falls, the drain-source current thereof is increased, causing the potential at the point B to rise. From the foregoing, the potential at the point B (the potential difference between the points A-A') can be adjusted by adjusting the gate voltage of the PMOS transistor P1.

Next, the operation of the first comparator circuit 3 will be described. Here, a comparison reference potential (corresponding to the logical level determining reference potential Vth in the first embodiment. Hereinafter designated by "Vth") is chosen to be the divided voltage value Vdd/2 generated by the resistors R4 and R5.

The PMOS transistors P4 and P5 form a current mirror circuit. Therefore, if there is a difference between the potential at the point B applied to the gate terminal of the NMOS transistor N5 and the logical level determining reference potential Vth applied to the gate terminal of the NMOS transistor N6, a current may flow into the capacitor C1 from a connection point of the drain terminal of the PMOS transistor P5 with the drain terminal of the NMOS transistor N6, or a current may flow into the connection point from the capacitor C1. This causes a charged voltage (integration voltage) on the capacitor C1 to change. The NMOS transistor N6 is applied with the constant reference voltage Vth at the gate terminal. For this reason, the amount of charging/discharging current to/from the capacitor C1 depends on the characteristics of the NMOS transistor N5 which is applied at the gate terminal with the potential at the point B.

In other words, it can be thought that the NMOS transistor N5 and the capacitor C1 form an integrator circuit. Assuming that a mutual conductance of the NMOS transistor N5 is gm5, a change in a voltage at the gate terminal of the NMOS transistor N5 is integrated by the capacitor C1 in accordance with a time constant defined by gm5 and C1.

In the manner described above, the charged/discharged voltage on/from the capacitor C1 can be changed in accordance with the result of a comparison performed by the first comparator circuit 3. Then, the source-drain current of the PMOS transistor P1 can be changed to change the potential at the point B using the change in the charged voltage on the capacitor C1.

Next, the operation of the signal level sensing circuit 5 will be described.

The comparator Comp1 compares a constant voltage generated by the constant voltage source Vhigh (the value of which is also represented by Vhigh) with the potential at the point B. When the potential at the point B exceeds the constant voltage Vhigh, the comparator Comp1 conducts the PMOS transistor P6. On the other hand, the comparator Comp2 compares a constant voltage generated by the constant voltage source Vlow (the value of which is also represented by Vlow) with the potential at the point B. When the potential at the point B is lower than the constant voltage Vlow, the comparator Comp2 conducts the NMOS transistor N7.

Therefore, only the PMOS transistor P6 is conductive when the potential at the point B exceeds the constant voltage Vhigh, and only the NMOS transistor N7 is conductive when the potential at the point B is lower than the constant voltage Vlow. Both the PMOS transistor P6 and the NMOS transistor N7 are non-conductive when the potential at the point B is in a range of the constant voltages Vlow to Vhigh.

When both the PMOS transistor P6 and the NMOS transistor N7 are non-conductive, i.e., when the potential at the point B is a range of the constant voltages Vlow to Vhigh, no influence is exerted on the charged or resultant voltage (integrated voltage) on the capacitor C1 even if a connection point of the drain terminal of the PMOS transistor P6 with the drain terminal of the NMOS transistor N7 is connected to one end of the capacitor C1.

Also, when only the PMOS transistor P6 is conductive, i.e., when the potential at the point B exceeds the constant voltage Vhigh, a current from the power supply terminal Vdd flows into the capacitor C1 through the PMOS transistor P6. This charges the capacitor C1, causing the charged voltage (integration voltage) on the capacitor C1 to instantaneously rise.

Further, when only the NMOS transistor N7 is conductive, i.e., when the potential at the point B is below the constant voltage Vlow, a discharged current from the capacitor C1 flows to the ground point through the NMOS transistor N7. This discharges the capacitor C1, causing the charged voltage (integration voltage) on the capacitor C1 to instantaneously fall.

By the change in the charged voltage (integration voltage) on the capacitor C1 as described above, the potential at the point B is confined in the range of the constant voltages Vlow to Vhigh. In other words, the potential at the point B is limited in amplitude by the comparator Comp1 and the comparator Comp2.

The comparator Comp3, serving as the second comparator 4, is applied with a fixed divided voltage value Vdd/2 (Vth) generated by the resistors R4 and R5 and the potential at the point B. Then, the result of a comparison between the two is represented by a logical level, and output at an output terminal OUT.

As described above, likewise in the second embodiment, the variable gain amplifier circuit 2, first comparator circuit 3, and an integrator circuit comprised of the mutual conductance (gm5) of the NMOS transistor N5 and the capacitor C1 constitute a negative feedback circuit. The action of this negative feedback circuit stabilizes a DC potential at the point B to remain stable at the fixed voltage Vdd/2 determined by the resistors R4 and R5. Its changing rate is determined by a time constant defined by gm5 and C1, and corresponds to slow DC potential variations.

Also, in the second embodiment, the variable gain amplifier circuit 2, signal level sensing circuit 5, and capacitor C1 constitute a negative feedback circuit as well. The action of this negative feedback circuit confines the amplitude of the voltage at the point B within the range of the reference potentials Vhigh to Vlow. In this event, the output of the signal level sensing circuit 5 directly drives the capacitor C1. For this reason, the result of a comparison of the reference potentials (Vhigh and Vlow) with the potential at the point B is extremely rapidly reflected to the output of the second comparator circuit 4.

Thus, the essence of the second embodiment also lies in the provision of two feedback loops such that a low speed feedback loop is used to follow slow DC variations, while a high speed loop is used to follow rapid variations in the amplitude of the signal.

Though the illustration of signal waveform charts is omitted in the second embodiment, the four types of operations in FIGS. 2 to 5 explained in the first embodiment are performed in a similar manner as well in the second embodiment. Thus, explanation of the four types of operations is omitted for the second embodiment.

As described above, the demodulator circuit according to the second embodiment has a negative feedback loop which slowly compensates a demodulated signal for a DC potential through an integrator circuit. The demodulator circuit also has a negative feedback loop which senses a voltage amplitude of a demodulated signal and rapidly charges or discharges a capacitor in the integrator circuit in response to the result of the sensing. With these negative feedback loops, in the second embodiment, a rapid DC potential compensation and the same-code sequence tolerance can be flexibly set independently of each other by selecting the time constant of the integrator circuit as well as the fast charging/discharging capabilities.

Particularly, since the time constant of the integrator circuit is determined by the capacitor and the mutual conductance value of the transistor within the first comparator circuit, a simplified integrator circuit can be expected.

While the first and second embodiments have been described for an example in which the present invention is applied to a radio communication system, the present invention can be applied similarly to other communication systems such as an optical transmission system. In addition, the application of the present invention to another communication system will produce larger effects if the system intermittently receives signals.

Also, while the second embodiment has been described for the configuration using MOS-based unipolar transistors, the present invention may be implemented by using other devices such as bipolar transistors and so on. In addition, different types of unipolar transistors may also be used.

The present invention has, as its features, a portion comprised of the variable gain amplifier circuit, first comparator circuit, signal level sensing circuit and integrator circuit (i.e., the signal compensator circuit) in the embodiments. Also, the circuit on the input stage side is not limited to the detector circuit. Further, the circuit on the output stage side is not either limited to the second comparator circuit shown in the embodiments.

As described above, according to the signal compensator circuit and the demodulator circuit of the present invention, it is possible to rapidly compensate for a DC potential in a received signal as well as to compensate for DC variations due to a same-code sequence and so on.

It is understood that the foregoing description and accompanying drawings set forth the preferred embodiments of the invention at the present time. Various modification, additions and alternative designs will, of course, become apparent to those skilled in the art in light of the foregoing teachings without departing from the spirit and scope of the disclosed invention.

Thus, it should be appreciated that the invention is not limited to the disclosed embodiments but may be practiced within the full scope of the appended claims.

What is claimed is
1. A signal compensator circuit comprising:
variable gain amplifying means for amplifying an input signal with a gain variable with a gain control signal;
first signal generating means for detecting variations in a DC level of an output signal from said amplifying means to generate a DC level variation signal indicative of a magnitude of the detected variations in the DC level;
second signal generating means for detecting variations in an amplitude level of the output signal from said amplifying means to generate an amplitude level variation signal indicative of a magnitude of the detected variations in the amplitude level; and
gain control signal generating means for integrating said DC level variation signal with a predetermined time constant, integrating said amplitude level variation signal with a time constant smaller than said predetermined time constant, and generating said gain control signal based on results of the integrations.

2. A signal compensator circuit according to claim 1, wherein said first signal generating means generates, as said DC level variation signal, a positive voltage signal when an output signal level from said amplifying means exceeds a predetermined threshold value, and a negative voltage signal when said output signal level is below said predetermined threshold value.

3. A signal compensator circuit according to claim 1, wherein said second signal generating means generates, as said amplitude level variation signal, a positive voltage signal when an amplitude level of an output signal from said amplifying means exceeds a predetermined upper limit threshold value, a negative voltage signal when said amplitude level is below a predetermined lower limit threshold value, and a zero voltage signal when said amplitude level lies between said predetermined upper limit threshold value and said predetermined lower limit threshold value.

4. A demodulator circuit comprising:
detecting means for detecting a modulated input signal;
variable gain amplifying means using an output from said detecting means as an input signal for amplifying said input signal with a gain in variable with a gain control signal;
first signal generating means for detecting variations in a DC level of an output signal from said amplifying means to generate a DC level variation signal indicative of a magnitude of the detected variations in the DC level;
second signal generating means for detecting variations in an amplitude level of the output signal from said amplifying means to generate an amplitude level variation signal indicative of a magnitude of the detected variations in the amplitude level;
gain control signal generating means for integrating said DC level variation signal with a predetermined time constant, integrating said amplitude level variation signal with a time constant smaller than said predetermined time constant, and generating said gain control signal based on results of the integrations; and
comparing means for comparing the output signal from said amplifying means with a predetermined reference level to output a digital signal which has a definite logical level.

5. A demodulator circuit according to claim 4, wherein said first signal generating means generates, as said DC level variation signal, a positive voltage signal when an output signal level from said amplifying means exceeds a predetermined threshold value, and a negative voltage signal when said output signal level is below said predetermined threshold value.

6. A demodulator circuit according to claim 4, wherein said second signal generating means generates, as said amplitude level variation signal, a positive voltage signal when an amplitude level of an output signal from said amplifying means exceeds a predetermined upper limit threshold value, a negative voltage signal when said amplitude level is below a predetermined lower limit threshold value, and a zero voltage signal when said amplitude level lies between said predetermined upper limit threshold value and said predetermined lower limit threshold value.

* * * * *